(12) United States Patent
Husted et al.

(10) Patent No.: US 6,721,547 B2
(45) Date of Patent: Apr. 13, 2004

(54) IN-BAND AND OUT-OF-BAND SIGNAL DETECTION FOR AUTOMATIC GAIN CALIBRATION SYSTEMS

(75) Inventors: Paul Husted, Mountain View, CA (US); Lars E. Thon, San Jose, CA (US); William McFarland, Los Altos, CA (US); Tao Fei Samuel Ng, Fremont, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 201 days.

(21) Appl. No.: 09/849,442

(22) Filed: May 4, 2001

(65) Prior Publication Data

US 2003/0012313 A1 Jan. 16, 2003

(51) Int. Cl.⁷ ................... H04B 17/00; H04L 27/06
(52) U.S. Cl. ............... 455/226.1; 455/232.1; 455/234.1; 455/226.2; 455/234.2; 375/316; 375/340; 375/344; 375/345
(58) Field of Search .............. 455/232.1, 234.1, 455/234.2, 226.1, 226.2, 296; 375/224, 345, 343, 316, 344, 340

(56) References Cited

U.S. PATENT DOCUMENTS

| | | | | |
|---|---|---|---|---|
| 5,463,662 A | * | 10/1995 | Sutterlin et al. | 375/351 |
| 5,579,435 A | * | 11/1996 | Jansson | 395/2.42 |
| 5,771,203 A | | 6/1998 | Soubaras | 367/46 |
| 5,809,085 A | * | 9/1998 | Goodson et al. | 375/320 |
| 5,999,561 A | | 12/1999 | Naden et al. | 375/206 |
| 6,067,293 A | | 5/2000 | Shoji | 370/342 |
| 6,085,077 A | * | 7/2000 | Fields et al. | 455/303 |
| 6,115,409 A | * | 9/2000 | Upadhyay et al. | 375/144 |
| 6,134,430 A | | 10/2000 | Younis et al. | 455/340 |
| 6,219,334 B1 | | 4/2001 | Sato et al. | 370/210 |
| 6,324,387 B1 | | 11/2001 | Kamgar et al. | 455/234.1 |

* cited by examiner

*Primary Examiner*—Vivian Chin
*Assistant Examiner*—Eugene Yun
(74) *Attorney, Agent, or Firm*—Pillsbury Winthrop LLP

(57) ABSTRACT

An embodiment of the present invention provides an automatic gain control system for a wireless receiver that quickly differentiates desired in-band signals from high power out-of-band signals that overlap into the target band. The system measures power before and after passing a received signal through a pair of finite impulse response filters that largely restrict the signal's power to that which is in-band. By comparing the in-band energy of the received signal after filtering to the total signal energy prior to filtering, it is possible to determine whether a new in-band signal has arrived. The presence of this new in-band signal is then verified by a multi-threshold comparison of the normalized self-correlation to verify the presence of a new, desired in-band signal.

54 Claims, 7 Drawing Sheets

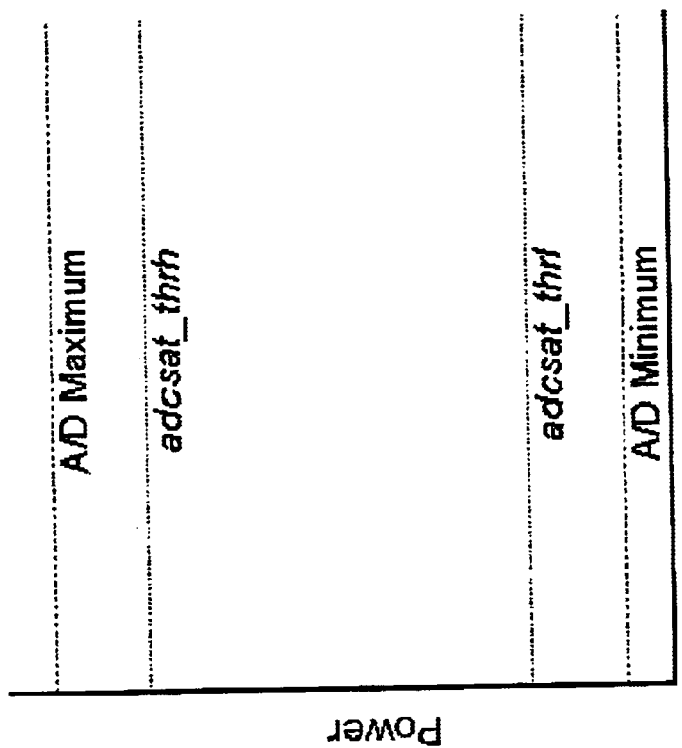

IN-BAND AND OUT-OF-BAND SIGNAL DETECTION FOR AUTOMATIC GAIN CALIBRATION SYSTEMS

BACKGROUND OF THE INVENTION

1. Field of the Invention

The present invention is directed to communication systems. More particularly, the invention is directed to receivers in wireless communication systems. Even more particularly, the present invention is directed to automatic gain control systems for such wireless communication system receivers.

2. Background of the Related Art

The use of receivers in wireless systems such as radio and cellular communication systems is well-known in the art. FIG. 1 shows a typical superheterodyne receiver design 10. Here, a radio frequency (RF) signal is received on antenna 15 and provided to RF amplifier 20. The RF signal is amplified by the RF amplifier 20 and in mixer 25 mixed with a signal from a local oscillator 30. This produces an intermediate frequency (IF) signal that is amplified in an IF amplifier 35 and filtered in a bandpass filter 40. The filtered IF signal is again amplified by an IF amplifier 45 and mixed in a product detector 50 with a signal from a beat frequency oscillator 55. The result is a signal that is amplified by a baseband amplifier 60 and digitized for further processing by an analog-to-digital (A/D) converter 65.

In such receivers, less amplifier gain is needed for strong signals, and it is important that a very strong signal not be amplified to the point that when amplified it distorts received information signals, overloads system components and possibly damages the components. For this reason, receivers typically have some sort of automatic gain control (AGC) system which controls one or more of the system amplifiers 20, 35, 45 and 60 to maintain the amplified signals within certain ranges (this control may be, e.g., through a bias applied to the amplifiers). In FIG. 1, the AGC unit 70 receives an IF input output by the IF amplifier 45 and uses it to generate bias signals controlling the RF amplifier 20 and the IF amplifiers 35 and 45.

SUMMARY OF THE INVENTION

An embodiment of the present invention provides an automatic gain control system for a wireless receiver that quickly differentiates desired in-band signals from high power out-of-band signals that overlap into the target band. The system measures power before and after passing a received signal through a number of filters that largely restrict the signal's power to that which is in-band. By comparing the in-band energy of the received signal after filtering to the total signal energy prior to filtering, it is possible to determine whether a new in-band signal has arrived. The presence of this new in-band signal is then verified by a multi-threshold comparison of the normalized self-correlation to verify the presence of a new, desired in-band signal.

BRIEF DESCRIPTION OF THE DRAWINGS

These and other aspects of an embodiment of the present invention are better understood by reading the following detailed description of the preferred embodiment, taken in conjunction with the accompanying drawings, in which:

FIG. 6 shows characteristics of A/D converter saturation in the embodiment; and

DETAILED DESCRIPTION OF PRESENTLY PREFERRED EXEMPLARY EMBODIMENTS

Figure 1:
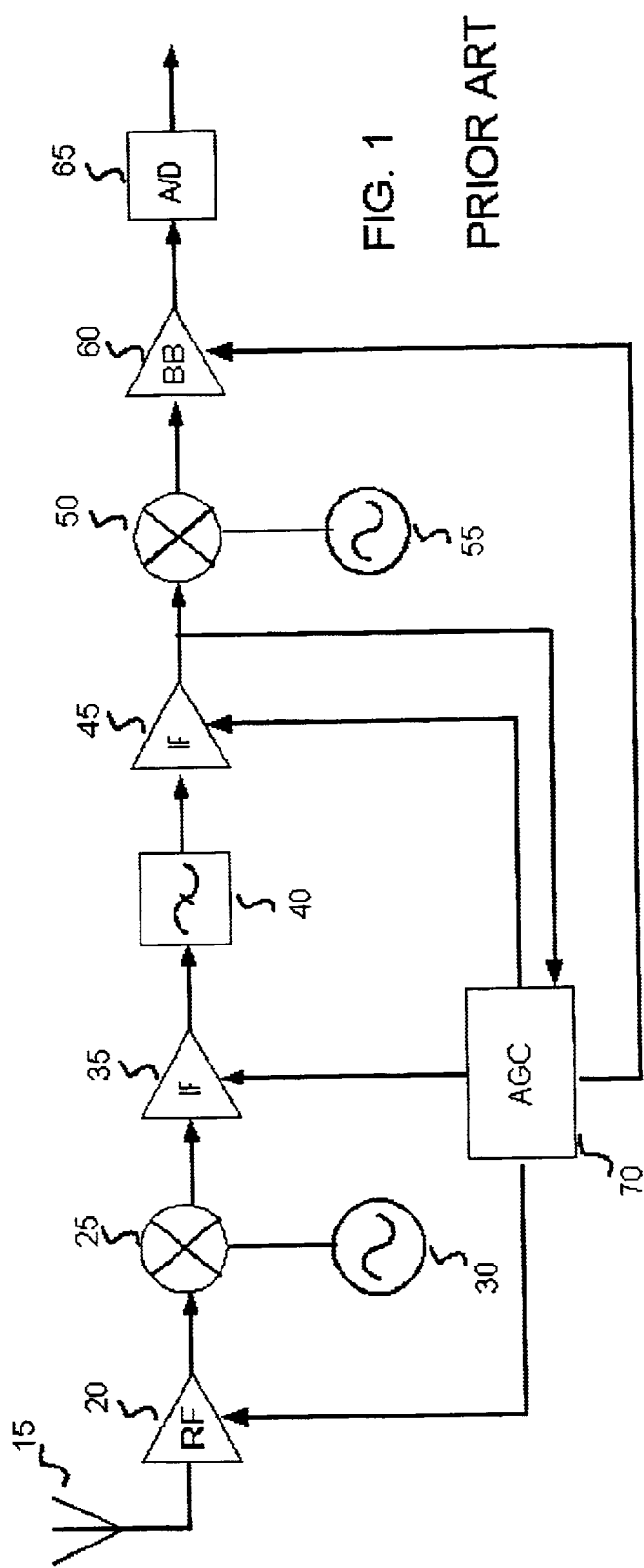
FIG. 1 shows the structure of a communications receiver of the prior art.
Figure 2:
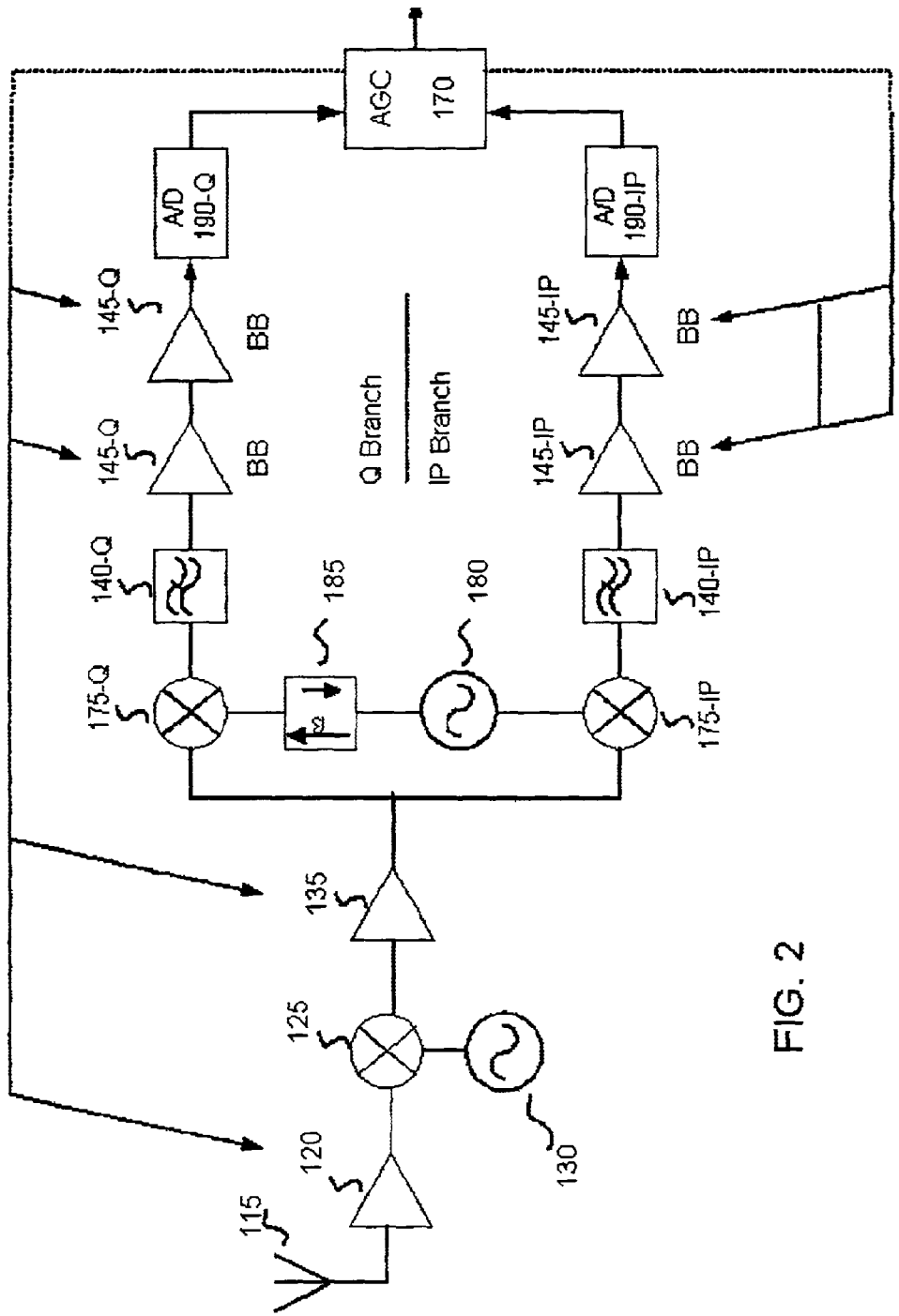
FIG. 2 shows the structure of a communications receiver of an embodiment of the present invention.

The basic structure of a receiver of an embodiment of the present invention is shown in FIG. 2. Here, a wideband antenna 115 receives a radio frequency (RF) RF signal and provides it to an RF amplifier 120, and a particular channel or signal within the band is preferably selected by varying the local oscillators 130 and 180. In the embodiment, the RF signal preferably conforms to the IEEE 802.11a standard, has a frequency in the 5 GHz band and is quadrature modulated to carry 6 to 54 Mbps. In this embodiment, the signal can carry up to 54 Mbits of data and lies within one of twelve 20 MHz wide slots, eight within a 5.15–5.35 GHz band and four within a 5.75–5.85 GHz band. The signal in this embodiment is a coded orthogonal frequency division multiplexed (OFDM) signal using 52 subcarriers spaced 312.5 kHz apart. It is understood, however, that while the following detailed description of the present invention is made in the context of an IEEE 802.11a system, that the inventions described herein have application to many different types of communication systems, and are not limited to systems operating within the IEEE 802.11a standard. For example, as described hereinafter the present invention described operating upon the short and long training symbols in an IEEE 802.11a system, but it is noted that the teachings related thereto can be generalized to any training sequence made up of one or more sinusoids. Thus, for example, power measurements can be made based upon half of a period of a slowest frequency sinusoid that exists within a training symbol containing a plurality of sinusoids, with each of the plurality of sinusoids having a frequency that is an integer multiple of the slowest frequency sinusoid. In 802.11a system this translates to half of a short training symbol sequence.

The amplified RF signal is mixed with a signal from a local RF oscillator 130 supplied to an RF mixer 125 to generate an intermediate frequency (IF) signal that is fed to an IF amplifier 135. Preferably, the sum of the frequencies of the local RF oscillator 130 and local IF oscillator 180 are in the range 5.15–5.35 and 5.75–5.85 GHz, with the ratio of the RF oscillator frequency to the IF oscillator frequency being 4:1. In the embodiment, the local oscillators 130 and 180 are preferably in a floating IF arrangement in which they both are variable, rather than a fixed IF arrangement where, e.g., only the RF local oscillator 130 is variable.

The amplified IF signals are supplied to an in-phase mixer 175-IP and a quadrature mixer 175-Q, respectively. One of the in-phase mixer 175-IP and the quadrature mixer 175-Q is directly driven by a local IF oscillator 180, and the other of the in-phase mixer 175-IP and the quadrature mixer 175-Q is driven by the local IF oscillator signal after it is phase-shifted by 90° in a phase shifter 185. In this way, in-phase (IP) and quadrature (Q) components of the received RF signal are obtained at the outputs of the in-phase mixer 175-IP and quadrature mixer 175-Q, respectively.

The mixed IF signals pass through low-pass filters 140-IP and 140-Q to select the desired channel and remove spectrally distant components not of interest, and are amplified by two series of baseband amplifiers 145-IP and 145-Q. Though two baseband amplifiers are shown in each branch, a different number of amplifiers may be used. Almost any desired baseband gain step arrangement may be developed using baseband amplifiers having appropriately selected programmable gains in a particular order.

Preferably, the low-pass filters 140-IP and 140-Q are two-pole elliptical filters having a 3 dB corner at 28 MHz. Moving from the analog to digital domain, the baseband amplifier outputs are fed to A/D converters 190-IP and 190-Q which digitize the in-phase and quadrature component signals, preferably with a frequency of 80 MHz, to a resolution of nine bits, and an input dynamic range of −500 mV to 500 mV.

Preferably, the A/D converters are pipeline A/D converters; however, the invention is not so limited. For example, sigma-delta or other converters may be used in their place.

An analog channel filter and/or anti-aliasing filter may advantageously be placed before the A/D converters 190-IP and 190-Q. In the preferred embodiment, the combination of the analog filters perform adjacent blocker rejection of 4 dB and an alternate blocker rejection of 20 dB. With a worst case of an adjacent blocker 16 dB larger and an alternate blocker 32 dB larger, a received blocker at the A/D converter input can be 12 dB higher than the in-band signal. As is known in the art, an adjacent blocker is an interference signal adjacent to or overlapping the frequency band of interest, while an alternate blocker is an interference signal farther away from the frequency band of interest.

The digitized I/Q component signals are provided to an automatic gain control (AGC) unit 170 whose operation with respect to the present invention will be described in greater detail below. The AGC 170 analyzes the I/Q component signals as described in greater detail below and generates gain control signals based thereon. These gain control signals are provided to the amplifiers 120, 135, 145-IP and 145-Q as shown by the dotted line in FIG. 2.

Figure 3:
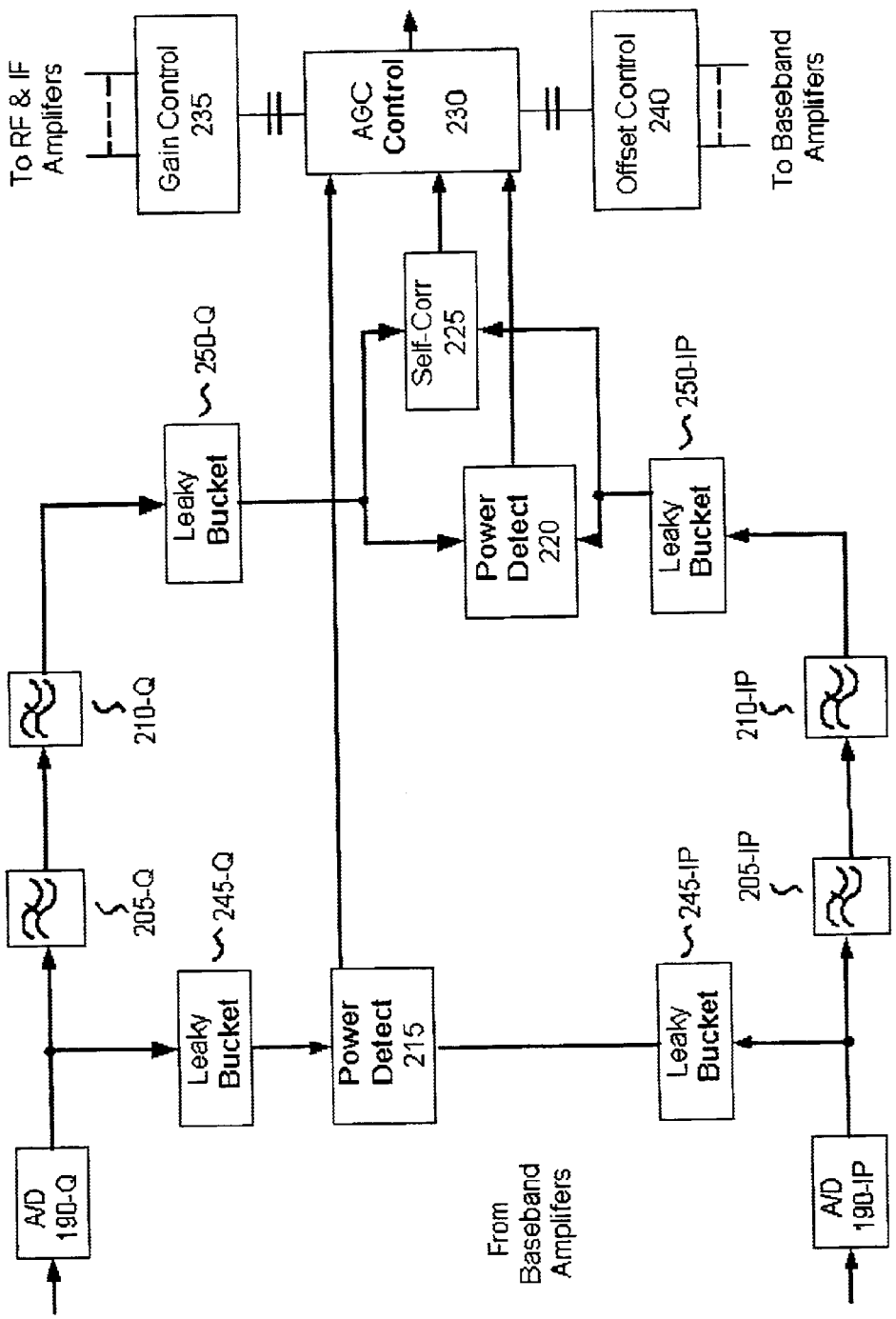
FIG. 3 shows the structure of an automatic gain control mechanism in the embodiment of FIG. 2.

More specifically, as shown in FIG. 3 the digitized IF signals from the A/D converters 190-IP and 190-Q are passed through leaky bucket filters 245-IP and 245-Q and finite impulse response (FIR) filters 205-IP, 210-IP and 205-Q, 210-Q. The first FIRs 205-IP and 205-Q are decimation filters that eliminate every other sample from their respective streams to reduce the data sampling rate from 80 MHz to 40 MHz for a normal 8.5 MHz single-sided bandwidth packet. The second FIRs 210-IP and 205-Q are standard low-pass filters which remove any residual adjacent or aliased blockers before sending the data to the self-correlator 225 and a power detector 220. Two power measurements are taken within the AGC 170—one from the output of the second FIR filter 210 by the power detector 220, and another from the output of A/D converters 190-IP and 190-Q by another power detector 215. These measurements are provided to AGC control logic 230 as will be described in greater detail below.

Although this embodiment uses digital FIRs, other types of filters, including analog filters, may be used in their place. If the system is not oversampled, the filters are preferably analog.

AGC control logic 230 receives the power measurements from power detectors 215 and 220 and uses them to control a gain control generator 235 to output analog gain control signals for each of the RF amplifier 120, the IF amplifier 135, and individual ones of the baseband amplifiers 145-IP and 145-Q. In the embodiment, the AGC control logic 230 provides a control word, ten bits in length in the preferred embodiment, to the gain control generator 235, and the gain control generator 235 generates appropriate control signals for the amplifiers. These gain control signals are fed back to the RF amplifier 120, the IF amplifier 135 and the baseband amplifiers 145-IP and 145-Q to control the gain of each as described above.

The embodiment uses an application-specific integrated circuit to implement the AGC control logic 230; however, an appropriately programmed processor, either embedded or discrete, or other appropriate device, may be used as well.

It should be noted that although FIG. 3 shows various components within the AGC 170 to be separate from one another, it is possible that two or more units may be integrated into one. For example, the AGC control logic 230 is shown separately from the FIRs 205, 210, power detectors 215, 220 and self-correlation unit 225; however, several of these may be combined into a single processor appropriately programmed to perform these functions. Further, a programmed processor need not be used and one or more of these components can be implemented in dedicated hardware.

The AGC 170 may control a DC offset control unit 240 to provide analog offset control signals to one or more of the baseband amplifiers 145-IP and 145-Q. DC offset control is done to ensure that the analog signals provided to the amplifiers and A/D converters 190-IP and 190-Q are properly centered and quantized.

AGC Operation

In the embodiment, the control logic 230 first checks to see if the signal is sufficiently saturating either of the A/D converters 190-IP and 190-Q. If so, a quick drop gain control procedure is executed; if not, a base gain control procedure, also described below, is executed.

Next, the AGC base gain control logic 230 determines whether the received signal is within a preferred range as described below. If so, no gain control is needed; otherwise, a gain control procedure described in greater detail below is executed.

Then, the AGC system 170 attempts to identify an in-band signal using strong signal and weak signal detection techniques, as described in greater detail below. If a signal is found, the detection process is complete; if not, the detection process is repeated on the next portion of the signal. Weak signal detection and strong signal detection are independent and complementary features. As described further herein, for strong signal detection, it is determined that a signal may exist by the arrival of a stronger signal necessitating a drop in receive gain, whereas for weak signal detection, it is determined that a signal may exist due to a sudden increase in measured in-band power at least proportional to the increase in total power at the ACC (while not requiring a gain change), followed shortly by a self-correlation exceeding thresholds. It is noted that it is preferable to disable weak signal detection, typically for a few microseconds, if a gain change is made, since self-correlation will not be valid until the entire viewing window for self-correlation is filled with post-gain-change values. Thus, weak-signal detection is used for arriving signals not large enough relative to blockers or noise to cause gain changes, and strong signal detection for larger arriving signals. And for strong signal detection, that a new signal has arrived is determined based upon whether a coarse gain drop or quickdrop gain results, as described below.

AGC Base Gain Control for a Coarse Gain Change

In operation, the AGC 170 must adjust receiver gains so that the received signal can properly be quantized by the A/D converter 190. If this signal is too big at the A/D converter input, the signal will be distorted by saturation. If the signal is too small at the A/D converter input, the quantization noise of the A/D converter 190 will render the received signal-to-noise (S/N) ratio too low for correct detection. For this purpose, the AGC control logic 230 digitally controls the analog variable gain stages mentioned above using the gain control unit 235. Preferably, the embodiment's gain control has a dynamic range of 93 dB–51 dB in the combined RF and IF stages 120 and 135 and 42 dB in the baseband stage 145.

The power detector 215 estimates the total digitized power at the A/D converters 190-IP and 190-Q by summing a window of instantaneous power calculations for half of a preamble short symbol window in an 802.11a signal (400 ns) for a total of 16 samples. For example, consider a signal coming out of a nine-bit A/D converter 190 with a range of [–256, 255], and measurement of power for this signal over a 16-bit sample window in half a preamble short symbol window. To do this, the AGC control logic 230 calculates the instantaneous power adcpwr1 on the A/D converter output stream adcoutput as $$adcpwr1 = \sum_{k=0}^{15} (real(adcoutput[k]))^2 + (imag(adcoutput[k]))^2 \quad (1)$$

This power measurement is then put into a log table, where its maximum value is zero. Thus, for a fully railed output with every value at –256, the logarithmic table output would be zero. The power of a full-rail sinusoid would be –3 dB; if every sample were 128, the power would be –6 dB, etc.

Figure 4:
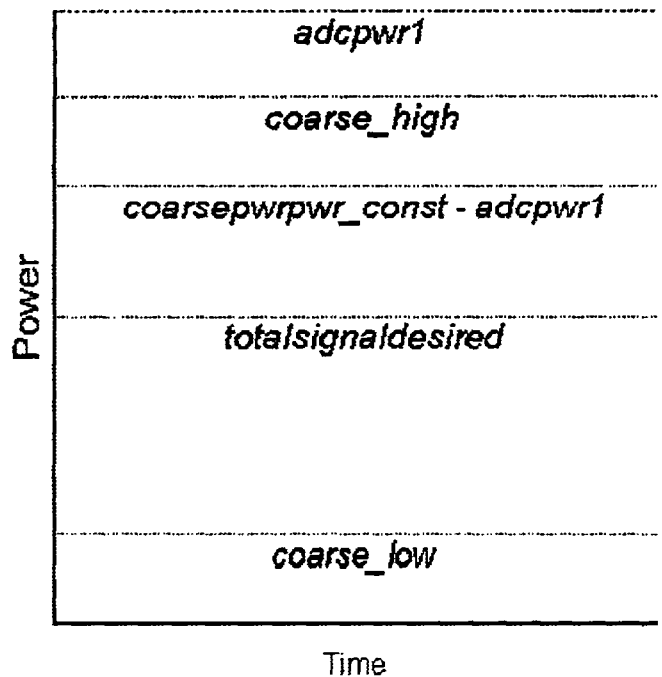
FIGS. 4 and 5 show desired characteristics of a gain-controlled signal.

The AGC control logic 230 uses this total power estimate to keep the signal in-range at the A/D converters 190-IP and 190-Q. If the signal power is determined to be out of range (but not saturating the A/D converters 190-IP and 190-Q), a coarse gain change will be made to put the signal back in range. More specifically, if AGC control logic 230 detects the total measured power adcpwr1 (in the embodiment, within the range –63–0 dB) is greater than the maximum desired A/D converter signal size, the desired gain value gaintarget, which is a signal size that is set large enough so that quantization noise is small enough, but also small enough that ADC saturation is not an issue, including the size of the signal and any potential blocker, is reduced in a course gain drop by the AGC control logic 230 of the equation $$gaintarget=gaintarget+(coarsepwr\_const-adcpwr1) \quad (2)$$

where coarsepwr_const is an additional gain for coarse gain drop (FIG. 4), e.g., –17 dB. This additional gain loss is used because the incoming signal may be too large to quantize but not large enough to trigger a quick drop as described in greater detail below—for example, if the signal saturates occasionally but not enough to trigger a quick drop. In such cases, it is useful to drop the gain by more than the gaintarget value indicates, based on power measurements of a saturated waveform—a very aggressive drop. Thus, the empirically determined coarsepwr_const value is added to increase the gain drop to more quickly converge on the desired signal size. The result is used to generate appropriate control signals for the amplifiers via the gain control generator 235.

Figure 5:
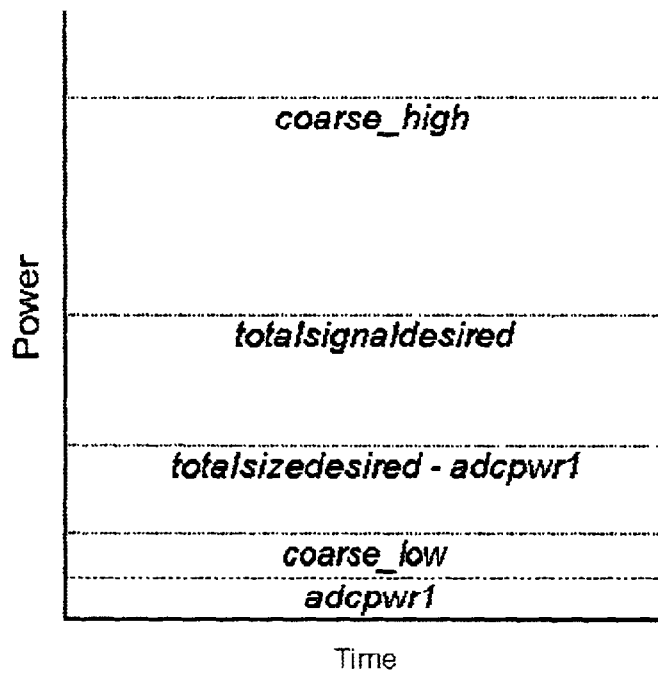

If the total measured power adcpwr1 is less than the minimum desired A/D converter signal size, the desired gain value gaintarget is increased by the AGC control logic 230 of the equation $$gaintarget=gaintarget+(totalsizedesired-adcpwr1) \quad (3)$$

where totalsizedesired is the target A/D converter signal size during coarse gain changes, i.e., the desired size of the A/D converter output in the absence of a desired signal (FIG. 5)—about –17 dB in the preferred embodiment.

AGC Quick Drop Gain Control

If the received signal is saturating the A/D converters 190-IP and 190-Q often, a precise power measurement may not be obtained; however, it is certain that the signal is well out of range. This information can be used to quickly reduce the gain. More specifically, a saturation counter adcsat is established by the AGC control logic 230 to count the number of saturations of either the I or Q A/D converter output samples. A pair of saturation thresholds adcsat_thrh and adcsat_thrl, which can be changed by downloading a different threshold, are used to counter any possible lack of A/D converter range. Thus, a saturation will be detected if $$adcoutput \geq (adcsat\_thrh+192) \quad (4)$$

or if $$adcoutput \leq (adesat\_thrl-256) \quad (5)$$

where adcsat_thrh is a high threshold less than the maximum A/D converter output value which designates saturation on the high side of the A/D converter output, adcsat_thrl is a low threshold value greater than the minimum A/D converter output value which designates saturation on the low side of the A/D converter output (FIG. 6) and the constant values are implementation-dependent. adcsat_thrh is set to be slightly less than the maximum A/D converter output, while adcsat_thrl is set to be slightly higher than the minimum A/D converter output. This is useful because it allows signals that are close to saturation of, but do not actually saturate, the A/D converter to be classified as saturation signals for more flexibility. If the number of saturations of the A/D converter output samples during a sample window of adcsat_icount cycles (preferably less than or equal to eight, the number of cycles in the quarter-symbol 802.11a measurement window) exceeds a saturation threshold amount adcsat_thresh a quick gain drop is instructed by the AGC control logic 230, and gaintarget is reduced by a predetermined amount quick_drop, e.g., a –30 dB change in gain. In the preferred embodiment, the adcsat_thresh is set for at a threshold of 12 saturations in an 8-cycle window (with saturations independently possible on I and Q ADCs).

This technique may advantageously be implemented in the following way. After calibration or any gain change, an AGC settling time occurs. After that adcpwr1, the variable corresponding to the amount of measured power, is reset and an acc_count counter, preferably an eight-bit incremental counter cycling continuously during AGC operation, also is reset.

The following events will happen of the counter acc_count:

mod(acc_count, 16)=0: reset adcpwr1 accumulator mod(acc_count, 16)=1: clear reset on adcpwr1 accumulator mod(acc_count, 16)=2: store adcpwr1 mod(acc_count, 16)≦adcsat_icount and adcsat=1 (asserted when set_thresh saturations, e.g. eight saturations, have been counted), the saturation counter has exceeded adcsat_thresh and a quick gain drop should be executed. As shown, in the preferred embodiment, the adcpwr1 values are computed every 16 cycles, and the system looks for adcsat to be asserted prior to the first 4 bits of the counter registering a value greater than adcsat_icount (preferably 8).

AGC Packet Detection

Once the received signal is in-range, the AGC control logic 230 detects the presence of a desired packet. For this purpose, the AGC control logic 230 determines an in-band power estimation, uses the FIR filters 205-IP, 210-IP and 205-Q and 210-Q to reduce all adjacent and alternate blockers to 20 dB below the in-band signal power at 802.11a specified maximum levels, and compares adcpwr1 and firpwr1 as described hereinafter. This is done to obtain information about whether quantized signal energy at the A/D converter 190-IP or 190-Q is in-band or out-of-band—information which helps in finding the desired packets.

Figure 7A:
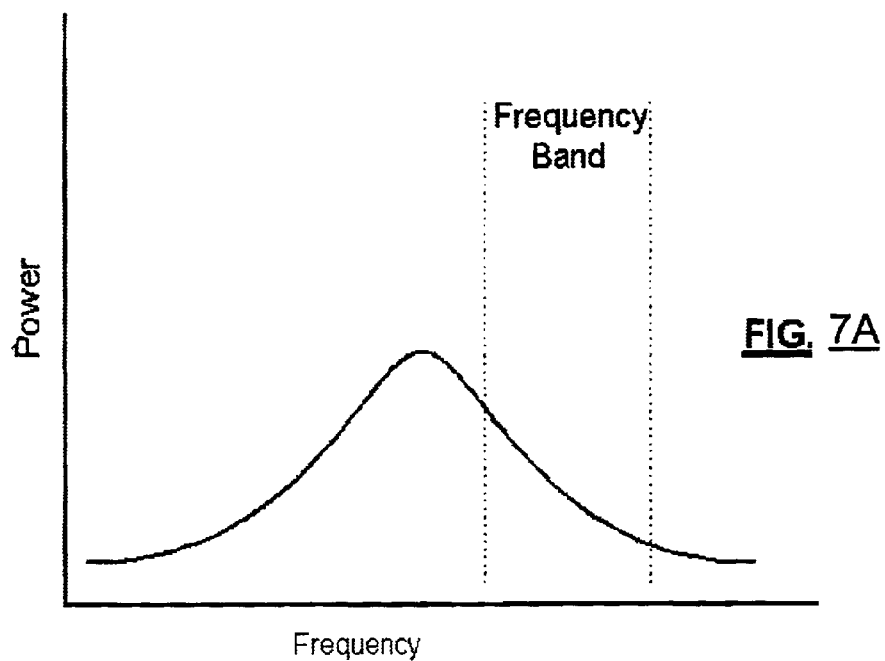
FIGS. 7A, 7B, 8A and 8B show characteristics of in-band and out-of-band signals.
Figure 7B:
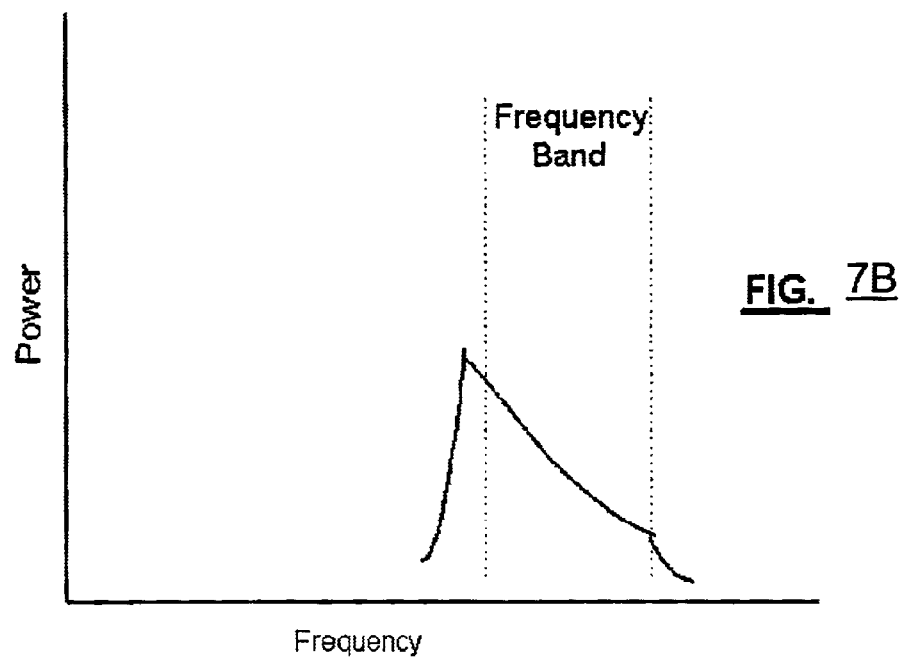

More specifically, consider the signal shown in FIG. 7A. Calculating the power of an A/D converter output as described above might determine that it has an overall power of, say, −12 dBr, where dBr is a measure of the RMS size of signals below the full rail signal size described above with reference to Equation (1). Passing through the second FIR 210-IP or 210-Q as shown in FIG. 7B, however, the signal loses most of its power and is reduced to a level of about −25 dBr—a decrease of roughly 85%. Since most of the signal's power was blocked by the bandpass FIR 210-IP or 210-Q, it is presumed to be an out-of-band signal.

Figure 8A:
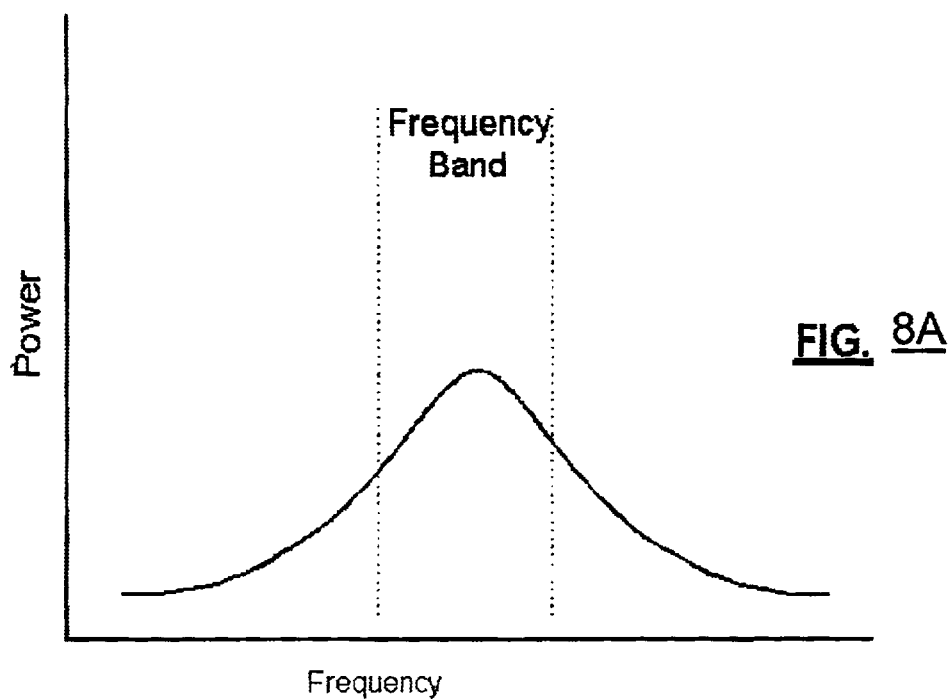
Figure 8B:
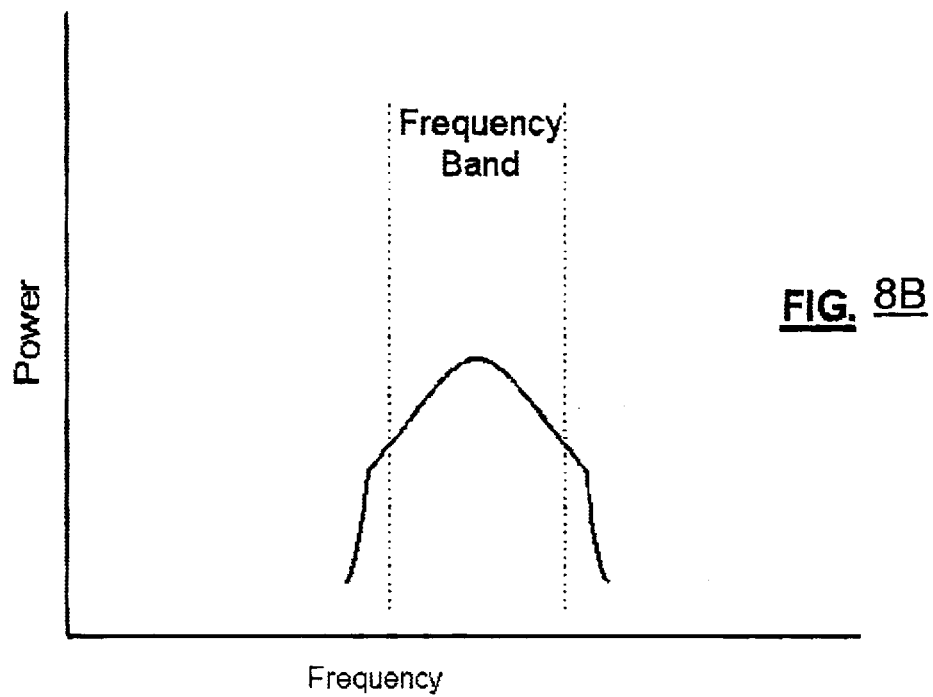

Referring to the signal shown in FIG. 8A, this signal too has an overall power of about −12 BDr as measured at the A/D converter output. Passing through the second FIR 210-IP or 210-Q as shown in FIG. 8B, however, only reduces its power to approximately −15 dBr—a decrease of only about 10%. Since most of the signal's power was passed by the bandpass FIR 210-IP or 210-Q, it is presumed to be an in-band signal.

With this understanding, the in-band power is calculated as the sum of instantaneous power measurements, preferably in a 32 sample, 0.8 $\mu$s window similar to the overall power calculation adcpwr1 described above. firpwr1 is the power based on the lowest of some number of samples that is less than the entire number of samples obtained, such as 28 out of 32 samples in the 32 sample window in detector 220. It is noted that the number of samples for firpwr1 is greater than the number of samples for adcpwr1 because firpwr1 is being used for fine gain control, where precision is important, whereas adcpwr1 is being used for coarse gain changes, where a slightly noisy power estimate will do. It is also noted that while for purposes of this in-band power calculation less than the entire number of samples is preferably used, that other post analog to digital converter processing that takes place using such samples will typically use all the samples obtained.

This less than the entire number of samples is used because during periods of interference, e.g., at symbol boundaries of the interferers, a temporary in-band power spike may occur due to high-frequency components of interferers at the symbol transition becoming in-band components in the desired band. This will artificially show up as a step in the in-band power. Windowing at the transmitter of the interferer, e.g., using a value which is half the previous value added to half the subsequent value at the symbol boundary, reduces this somewhat, as does lowpass filtering, so that the aggregate spectrum passes the necessary spectral mask. These instantaneous high frequency peaks, although lowered, can still exist. When an adjacent interferer is present, this temporary high frequency component in the interferer is actually in-band for the desired signal, so that the in-band power measurement when no desired signal is present can get a quick spike for a few samples, looking like an increase in the in-band power. To combat this, the lowest 28 of the 32 samples are used so this temporary spike is nulled out by not counting those values, and thresholds are adjusted accordingly to compensate for the reduced power measurement due to the missing four samples. Once a signal of interest is present, however, all samples are preferably used in creating the power measurement to make a detailed measurement. This second power measurement is called firpwr_all. Using the power information described above, desired signals can be found in two ways: strong signal detection and weak signal detection. Strong signal detection will be described first.

Strong Signal Detection

Any time a coarse gain drop or quick gain drop as described above occurs, a flag strongsignal is set by the AGC control logic 230. This flag remains high until the signal is determined to be in range at the A/D converter 190-IP or 190-Q, and the algorithm proceeds to make a firpwr1 measurement as described above. At this point, flag_relpwr is calculated as $$\text{flag\_relpwr=set if } (firpwr1 > relpwr + adcpwr) \tag{6}$$

(where relpwr is an empirical thresholding variable related to the absolute digital size of the in-band signal relative to the absolute total digital signal at the A/D converter 190-IP or 190-Q), thus attempting to see that most of the computed power is in-band. If flag_relpwr is high and strongsignal is high, then a new, very strong in-band signal has appeared. In this way, the embodiment permits examination of an oversampled incoming signal having digitized frequencies beyond a desired frequency range due to oversampling, and determine whether most of its power is in-band before determining that a desired signal has been found.

Thus, when flag_relpwr is high and strongsignal is high, the signal_found flag is asserted, a fine gain change is made as described below and the AGC process is completed once the number of consecutive gain changes is equal to or greater than the minimum number of gain changes deemed to constitute a successful AGC operation, i.e., when there have been enough gain changes to ensure a full programmable amplifier ramp-up when the system is turned on.

Weak Signal Detection

In weak signal detection, the normalized self-correlation of short sequences as defined below is measured to look for anything in-band with a periodicity of 0.8 $\mu$s in the preferred embodiment. This is a two-step process performed concurrently with the above-described strong signal detection process. First, the system waits for the normalized self-correlation as measured by the self-correlation processor 225 to exceed a first normalized self-correlation magnitude threshold value m1thres.

The self-correlation processor 225 preferably measures self-correlation of 802.11a packets by taking 32 samples in a short training symbol at the beginning of a packet and comparing each of the samples to a corresponding sample from the preceding short training symbol. More specifically, the self-correlation of an A/D converter stream adcoutput is given by $$\text{self\_corr} = \frac{[\Sigma \, adcoutput[n] \cdot conj(adcoutput[n-32])]^2}{\Sigma \, adcoutput[n]^2} \qquad (7)$$

where the denominator is a normalization factor. One can see that the numerator will be relatively high when x[n] and x[n−32] are identical and relatively low when, e.g., they are uncorrelated. Thus, this measure can serve as a good indicator of self-correlation.

Detecting when the self-correlation output exceeds m1thres can thus detect the existence of an incoming packet; however, it would also detect interferers, since they can have structures that can also self-correlate. For this reason, the embodiment advantageously employs another test. Once the normalized self-correlation exceeds m1 thres, the system enters a loop and for m1count_max cycles counts in a variable m1 tally the number of times the normalized self-correlation exceeds a second normalized self-correlation magnitude threshold value m2thres, where m2thres is less than or equal to m1thres. If m1tally>m2count_thr, a threshold of the count of normalized self-correlation>m2thres, before m1count_max (a window length for the self-correlation count) cycles have elapsed, weak signal detection may be detected.

As noted above, the windowing technique based on m1count_max is used because both interferers and noise may have a self-correlation that momentarily exceeds a threshold, but the chances of this occurring diminish when windows of samples obtained over consecutive periods of time are used. For example, a subsequent window will contain many of the same samples as the previous window, but the previous window will not contain the most recent sample from the subsequent window, and the subsequent window will not contain the oldest sample from the previous window. Thus, for example, if two 802.11a symbols in adjacent channels are sent, such that they are separated in frequency by 20 MHz, the last 0.8 μs of the first symbol will exactly match the next 0.8 μs guard period of the next symbol, creating self-correlation, but this spike will rapidly fade, in comparison with a preamble where a flat normalized self-correlation result is expected for the preamble duration.

Thus, the embodiment provides a way of performing a two-threshold windowing process on a self-correlation measurement. One threshold is used to determine that a signal may be present in-band, and the number of times a second threshold is exceeded in different windows of offset samples is counted to further determine if that in-band signal is a desired signal. This is done to combat temporary correlation of thermal noise as well as to combat self-correlation during the data segment of an interferer.

Additionally, for further robustness against thermal noise and interferers, the embodiment preferably requires that to enable a weak signal detection result, a potential detected packet must increase the in-band signal power by at least a certain amount and that the increase be at least proportional to any increase in the total signal power, the signal power being of at least a certain minimum size. This provides extra sensitivity when a new in-band signal comes in below an interferer or near the noise floor, thus not triggering strong signal detection but worthy of a look for weak signal detection.

At least three things may stop weak signal detection from occurring once m1tally>m1thresh. First, if ycOK=0, weak signal detection will not occur. ycOK is a decrementing counter that is reset to ycOKmax (in the embodiment, four) to enable weak signal detection if it is determined that an increase in the in-band signal of a certain size (flag_firstep) and at least proportional to any increase in the total power (flag relstep) with the measured firpwr1 of at least a certain minimum size (flag_firpwr), then it is possible that a new in-band signal has come in below an interferer or near the noise floor, thus not triggering strong signal detection but worthy of a look for weak signal detection. To ensure that such recognition occurs within a limited period of time, the above must happen while ycOK>0 if it happens at all. To perform these step calculations, old values of firpwr1 and adcpwr are stored as firpwr{2–4} and adcpwr{2–4}. Enough values are stored so that if the signal is detected during a programmable amplifier ramp, enough difference will exist between the first and last measurements to exceed the given threshold.

Another reason why weak signal detection might not occur is because gc_count is greater than zero. gc_count measures the time since the last gain change in short symbol increments, getting decremented by the AGC control logic 230 for every valid firpwr1 measurement from its starting value of three after a gain change. The idea is that after a gain change, there is a minimum amount of time until a self-correlation is valid.

Finally, weak signal detection will not occur if the signal has already been found with another method, since then there is no need to find it using weak signal detection.

AGC Packet Detection—DC Offset Elimination

The above double threshold arrangement is successful in reducing false packet detects on interferers during weak signal detection; however, it is not particularly successful in preventing false detection with respect to DC signals, which always self-correlate. There is typically a small DC component at the output of the A/D converter 190, so the embodiment uses a two-tap DC notch filter as a leaky bucket filter—more specifically, a two-tap IIR filter having a transfer curve of the form $$y[n] = \frac{\alpha-1}{\alpha} y[n-1] + \frac{1}{\alpha} x[n] \qquad (8)$$

where x is the input signal, y is the output signal and α is a filter parameter (in this case, 32)—which uses an estimate of the DC level provided by the AGC logic control 230 to cancel the DC component out. The AGC control logic 230 obtains this level from a lookup table based on current gain settings.

AGC Completion Processing

Once the signal is found via either strong signal detection or weak signal detection, fine gain changes will be made, in the preferred embodiment if consec_gainchanges<min_gainchanges. And in the preferred embodiment, every fine gain change will be made based upon the equation $$\text{gain\_change} = adc\_desired\_size - firpwr1\_all \qquad (9)$$

consec_gainchanges begins at zero for strong signal detection and two for weak signal detection, since it is meant to be a coarse measure of time spent in the AGC, and it takes approximately two gain change times to perform a windowed self-correlation. It is incremented every coarse and fine gain change. It is reset when no gain change is made and strong signal detection does not decide that a signal is present. This feature is meant to ensure that a minimum amount of time is spent in the AGC, for either more precise gain or to be sure the gain is set after the PA is done ramping.

The preferred embodiments described above have been presented for purposes of explanation only, and the present invention should not be construed to be so limited. Variations on the present invention will become readily apparent to those skilled in the art after reading this description, and the present invention and appended claims are intended to encompass such variations as well.

What is claimed is:

1. A method of estimating whether a received strong signal is an in-band signal based upon power estimates, the method comprising the steps of:
    inputting the received strong signal;
    estimating a power of the received strong signal by summing instantaneous power calculations;
    providing the received strong signal to a filter section;
    using the filter section to pass frequency components of the received strong signal within a desired band of frequencies and at a desired data sampling rate to obtain a filtered signal;
    estimating a power of the filtered signal by summing instantaneous power calculations; and
    comparing the power estimate of the received strong signal to the power estimate of the filtered signal to obtain an indication that the received signal is estimated as being in-band.

2. The method of claim 1, wherein estimating the power of the received strong signal and estimating the power of the filtered signal are performed by summing instantaneous power calculations within windows of the received strong signal and the filtered signal, respectively.

3. The method of claim 2, wherein extreme instantaneous power calculations in the power estimate of the received strong signal and in the power estimate of the filtered signal are not used in the respective estimates.

4. The method of claim 3, wherein highest magnitude instantaneous power calculations in the power estimate of the received strong signal and in the power estimate of the filtered signal are not used in the respective estimates.

5. The method of claim 4 wherein prior to the step of estimating the power of the received strong signal there is included the step of removing DC offset from the input signal.

6. The method of claim 4 wherein the step of estimating the power of the received strong signal uses a different number of signal instantaneous power calculations than the step of estimating the power of the filtered signal.

7. The method of claim 4 wherein the received strong signal power estimate is made based upon less than a received whole short training symbol.

8. The method of claim 4 wherein the received strong signal power estimate is made based on half of a period of a slowest frequency sinusoid that exists within a training symbol containing a plurality of sinusoids, with each of the plurality of sinusoids having a frequency that is an integer multiple of the slowest frequency sinusoid.

9. The method of claim 2 wherein prior to the step of estimating the power of the received strong signal there is included the step of removing DC offset from the input signal.

10. The method of claim 2 wherein the step of estimating the power of the received strong signal uses a different number of signal instantaneous power calculations than the step of estimating the power of the filtered signal.

11. The method of claim 1, wherein comparing the power estimates of the received strong signal and the filtered signal includes determining whether the filtered signal power estimate is at least a certain portion of the received signal power estimate.

12. The method of claim 1 wherein prior to the step of estimating the power of the received strong signal there is included the step of removing DC offset from the input signal.

13. The method of claim 1, further including the step of determining that the received strong signal is a desired signal after the indication has been provided.

14. The method of claim 1 wherein the received signal power estimate is performed on less than a whole short training symbol.

15. The method of claim 14 wherein the received signal power estimate is performed on about one half of a received whole short training symbol.

16. A method of estimating whether an input signal is an in-band signal, the method comprising the steps of:
    inputting the input signal;
    converting the input signal to a received digital signal using an analog to digital converter;
    determining whether the received digital signal is saturating the analog to digital converter and if so identifying the digital signal as a strong signal type;
    estimating the power of the received digital signal by summing instantaneous power calculations;
    determining whether the power of the received digital signal is greater than a desired level and if so identifying the received digital signal as the strong signal type;
    providing the received digital signal to a filter section;
    using the filter section to pass frequency components of the received digital signal within a desired band of frequencies to obtain a filtered signal;
    estimating a power of the filtered signal by summing instantaneous power calculations;
    comparing the power estimate of the received digital signal to the power estimate of the filtered digital signal to obtain an indication that the received digital signal is an in-band signal type; and
    determining that the received digital signal is an in-band signal if the received digital signal is indicated as being of the in-band signal type and is identified as being of the strong signal type.

17. The method of claim 16 further including the steps of:
    reducing a gain provided by an automatic gain control circuit to an automatic gain control amplification section if saturation is determined; and
    reducing a gain provided by the automatic gain control circuit to the automatic gain control amplification section if the power of the received digital signal is greater than the desired level.

18. The method of claim 16, wherein estimating the power of the received digital signal and estimating the power of the filtered signal are performed by summing instantaneous power calculations within windows of the received digital signal and the filtered signal, respectively.

19. The method of claim 18, wherein extreme instantaneous power calculations in the power estimate of the received digital signal and in the power estimate of the filtered signal are not used in the respective estimates.

20. The method of claim 19, wherein highest magnitude instantaneous power calculations in the power estimate of the received digital signal and in the power estimate of the filtered signal are not used in the respective estimates.

21. The method of claim 20 wherein prior to the step of estimating the power of the received digital signal there is included the step of removing DC offset from the input signal.

22. The method of claim 20 wherein the step of estimating the power of the received digital signal uses a different number of signal instantaneous power calculations than the step of estimating the power of the filtered signal.

23. The method of claim 20 wherein the received digital signal power estimate is performed on less than a received whole short training symbol.

24. The method of claim 23 wherein the received digital signal power estimate is performed on about one half of a received whole short training symbol.

25. The method of claim 18 wherein prior to the step of estimating the power of the received digital signal there is included the step of removing DC offset from the input signal.

26. The method of claim 18 wherein the step of estimating the power of the received digital signal uses a different number of signal instantaneous power calculations than the step of estimating the power of the filtered signal.

27. The method of claim 18, wherein comparing the power estimates of the received strong signal and the filtered signal includes determining whether the filtered signal power estimate is at least a certain portion of the received signal power estimate.

28. The method of claim 16 wherein prior to the step of estimating the power of the received strong signal there is included the step of removing DC offset from the input signal.

29. The method of claim 16 wherein the received signal power estimate is determined base upon less than a whole short training symbol.

30. The method of claim 29 wherein the received signal power estimate is determined based upon about one half of a received whole short training symbol.

31. The method of claim 16 further including the step of making a fine automatic gain control adjustment if it was determined that an in-band signal exists.

32. A method of determining that a received digital signal of a strong signal type exists within an input signal including the steps of:
   converting the input signal to the received digital signal using an analog to digital converter;
   estimating the power of the received digital signal by summing instantaneous power calculations;
   determining whether the power of the received digital signal is greater than a desired level and if so identifying the received digital signal as the strong signal type; and
   determining whether the received digital signal saturates the analog to digital converter and if so identifying the received digital signal as the strong signal type, wherein the step of determining includes:
      counting a number of times that a plurality of samples of the received digital signal exceeded the predetermined saturation threshold; and
      comparing the number of times with a predetermined saturation count threshold, such that when the predetermined saturation threshold is exceeded, the received digital signal is determined to saturate the analog to digital converter.

33. The method of claim 32 further including the step of reducing a gain provided by an automatic gain control circuit to an automatic gain control amplification section if the power of the received digital signal is greater than the desired level.

34. The method of claim 33 wherein the step of reducing the gain reduces the gain by an amount that is based upon the estimated power and a predetermined gain target value.

35. The method of claim 32 further including the step of:
   reducing a gain provided by an automatic gain control circuit to an automatic gain control amplification section if the received digital signal is determined to saturate the analog to digital converter.

36. The method of claim 35 wherein the step of reducing the gain reduces the gain a predetermined amount.

37. A system for detecting in-band signals, the system comprising:
   a filter section for filtering a received digital signal to pass frequency components of the received strong signal within a desired band of frequencies and at a desired data sampling rate to obtain a filtered signal;
   a power detector for estimating a power of the filtered signal and for estimating a power of the received digital signal by summing instantaneous power calculations of the respective signals; and
   control logic for, based on the estimated powers of the received digital signal and the filtered signal, respectively, determining whether the received signal is an in-band signal.

38. The system of claim 37, wherein the filter section includes a finite impulse response filter.

39. The system of claim 37, wherein the filter section includes a decimation filter.

40. The system of claim 37, wherein the filter section includes a low-pass filter.

41. The system of claim 37, wherein the power detector includes separate power detectors for estimating the powers of the received digital signal and the filtered signal, respectively.

42. The system of claim 41, wherein each of the power detectors includes a sampler configured to take instantaneous power calculation samples of its respective signal within windows thereof.

43. The system of claim 41 wherein each of the power detectors does not use highest magnitude instantaneous power calculations in the power estimate of its respective signal.

44. The system of claim 37, wherein the filtered signal power estimate uses at least certain signal instantaneous power calculations from the received signal power estimate.

45. The system of claim 37 further including a DC offset control unit for removing DC offset from the input signal.

46. The system of claim 37 wherein the control logic includes:
   means for determining whether the power of the received digital signal is greater than a desired level and if so identifying the received digital signal as the strong signal type.

47. The system of claim 46 further including:
   means for reducing a gain provided by an automatic gain control circuit to an automatic gain control amplification section if the power of the received digital signal is greater than the desired level.

48. The system of claim 47 wherein the means for reducing the gain reduces the gain by an amount that is based upon the estimated received digital signal power and a predetermined gain target value if the power of the received digital signal is greater than the desired level.

49. The system of claim 47 further including:
   means for determining whether the received digital signal saturates the analog to digital converter and if so identifying the digital signal as the strong signal type.

50. The system of claim 49 wherein the means for determining includes
   means for counting a number of times that a plurality of samples of the received digital signal exceeded a predetermined saturation threshold; and means for comparing the number of times with a predetermined saturation count threshold, such that when the predetermined saturation threshold is exceeded, the received digital signal is determined to saturate the analog to digital converter.

51. The system of claim 49 further including:

means for reducing the gain provided by the automatic gain control circuit to the automatic gain control amplification section if the received digital signal is determined to saturate the analog to digital converter.

52. The method of claim 47 wherein the means for reducing the gain reduces the gain a predetermined amount if the received digital signal is determined to saturate the analog to digital converter.

53. A method of determining that a received digital signal of the strong signal type exists within an input signal including the steps of:

converting the input signal to a received digital signal using an analog to digital converter;

determining whether the received digital signal saturates the analog to digital converter, the step of determining including:

counting a number of times that a plurality of samples of the received digital signal exceeded the predetermined saturation threshold; and comparing the number of times with a predetermined saturation count threshold, such that when the predetermined saturation threshold is exceeded, the received digital signal is determined to saturate the analog to digital converter; and reducing a gain provided by an automatic gain control circuit to an automatic gain control amplification section if the received digital signal is determined to saturate the analog to digital converter.

54. The method of claim 53 wherein the step of reducing the gain reduces the gain a predetermined amount.

* * * * *